(12) United States Patent
Park et al.

(10) Patent No.: US 7,957,217 B2
(45) Date of Patent: Jun. 7, 2011

(54) METHOD OF CONTROLLING INTERNAL VOLTAGE AND MULTI-CHIP PACKAGE MEMORY PREPARED USING THE SAME

(75) Inventors: Moon-sook Park, Seoul (KR); Hoe-ju Chung, Yongin-si (KR); Jung-bae Lee, Yongin-si (KR)

(73) Assignee: Samsung Electronics Co., Ltd., Suwon-si, Gyeonggi (KR)

( * ) Notice: Subject to any disclaimer, the term of this patent is extended or adjusted under 35 U.S.C. 154(b) by 285 days.

(21) Appl. No.: 12/266,716

(22) Filed: Nov. 7, 2008

(65) Prior Publication Data

US 2009/0125687 A1    May 14, 2009

(30) Foreign Application Priority Data

Nov. 9, 2007 (KR) .................. 10-2007-0114292

(51) Int. Cl.
G11C 8/00 (2006.01)
(52) U.S. Cl. .............. 365/230.03; 365/189.09; 365/191; 365/230.02; 365/189.08
(58) Field of Classification Search ............. 365/230.03, 365/230.02, 189.09, 191, 230.06, 189.07, 365/189.08
See application file for complete search history.

(56) References Cited

U.S. PATENT DOCUMENTS

2007/0271409 A1* 11/2007 Miura et al. .................. 711/5

FOREIGN PATENT DOCUMENTS

| JP | 2006156814 A | 6/2006 |
| JP | 2006286048 A | 10/2006 |
| KR | 1020050004480 A | 1/2005 |
| KR | 1020070038586 A | 4/2007 |

\* cited by examiner

*Primary Examiner* — Thong Q Le
(74) *Attorney, Agent, or Firm* — Volentine & Whitt, PLLC

(57) ABSTRACT

The invention relates generally to a multi-chip package (MCP) memory device, and more particularly, but without limitation, to a MCP memory device having a reduced size. In one embodiment, the MCP memory device includes: a transfer memory chip; and a plurality of memory chips coupled to the transfer memory chip, each of the plurality of memory chips including an internal voltage generating circuit, the transfer memory chip configured to receive a plurality of command signals from outside the MCP memory device, the transfer memory chip further configured to output a plurality of control signals to the plurality of memory chips based on the plurality of command signals. Embodiments of the invention also relate to a method of controlling an internal voltage of the MCP memory device.

16 Claims, 3 Drawing Sheets

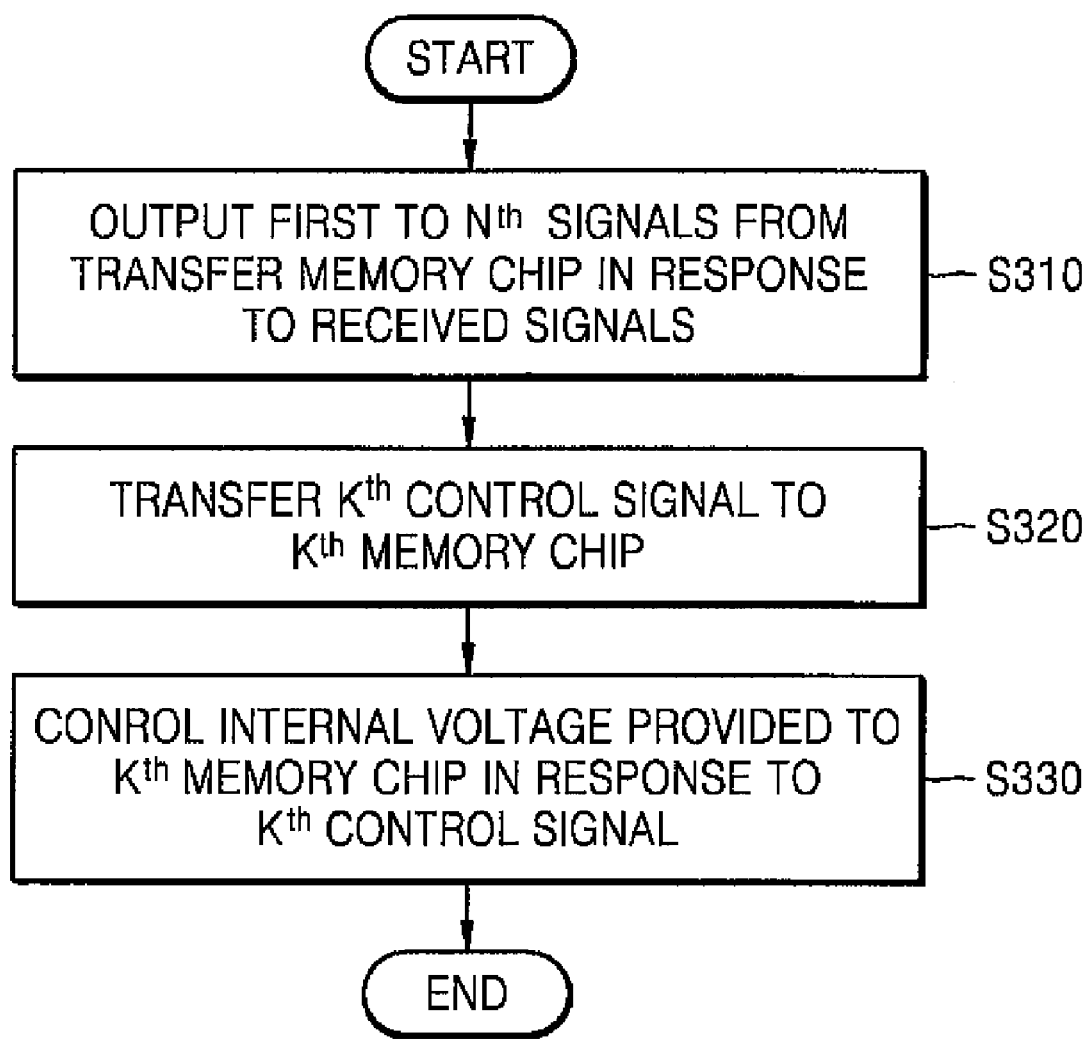

METHOD OF CONTROLLING INTERNAL VOLTAGE AND MULTI-CHIP PACKAGE MEMORY PREPARED USING THE SAME

CROSS-REFERENCE TO RELATED PATENT APPLICATION

This application claims the benefit of Korean Patent Application No. 10-2007-0114292, filed on Nov. 9, 2007, in the Korean Intellectual Property Office, the disclosure of which is incorporated herein in its entirety by reference.

SUMMARY OF THE INVENTION

The invention relates generally to a multi-chip package (MCP) memory device, and more particularly, but without limitation, to a MCP memory device having a reduced size. Embodiments of the invention also relate to a method of controlling an internal voltage of the MCP memory device.

According to an aspect of the invention, the MCP memory device includes: a transfer memory chip; and a plurality of memory chips coupled to the transfer memory chip, each of the plurality of memory chips including an internal voltage generating circuit, the transfer memory chip configured to receive a plurality of command signals from outside the MCP memory device, the transfer memory chip further configured to output a plurality of control signals to the plurality of memory chips based on the plurality of command signals.

According to another aspect of the invention, the method includes: receiving a plurality of command signals in the transfer memory chip, the plurality of command signals originating outside the MCP memory device; outputting a plurality of control signals from the transfer memory chip to the plurality of memory chips based on the received plurality of command signals; in each of the plurality of memory chips, selecting a corresponding one of the plurality of control signals to produce a selected control signal; and in each of the plurality of memory chips, controlling a corresponding one of the plurality of memory chip voltages based on the selected control signal.

BRIEF DESCRIPTION OF THE DRAWINGS

The above and other features and advantages of the invention will become more apparent by describing in detail exemplary embodiments thereof with reference to the attached drawings in which:

FIG. 3 is a flow diagram of a method for controlling an internal voltage of the multi-chip package (MCP) memory device, according to an embodiment of the invention.

DETAILED DESCRIPTION OF THE INVENTION

Figure 1:
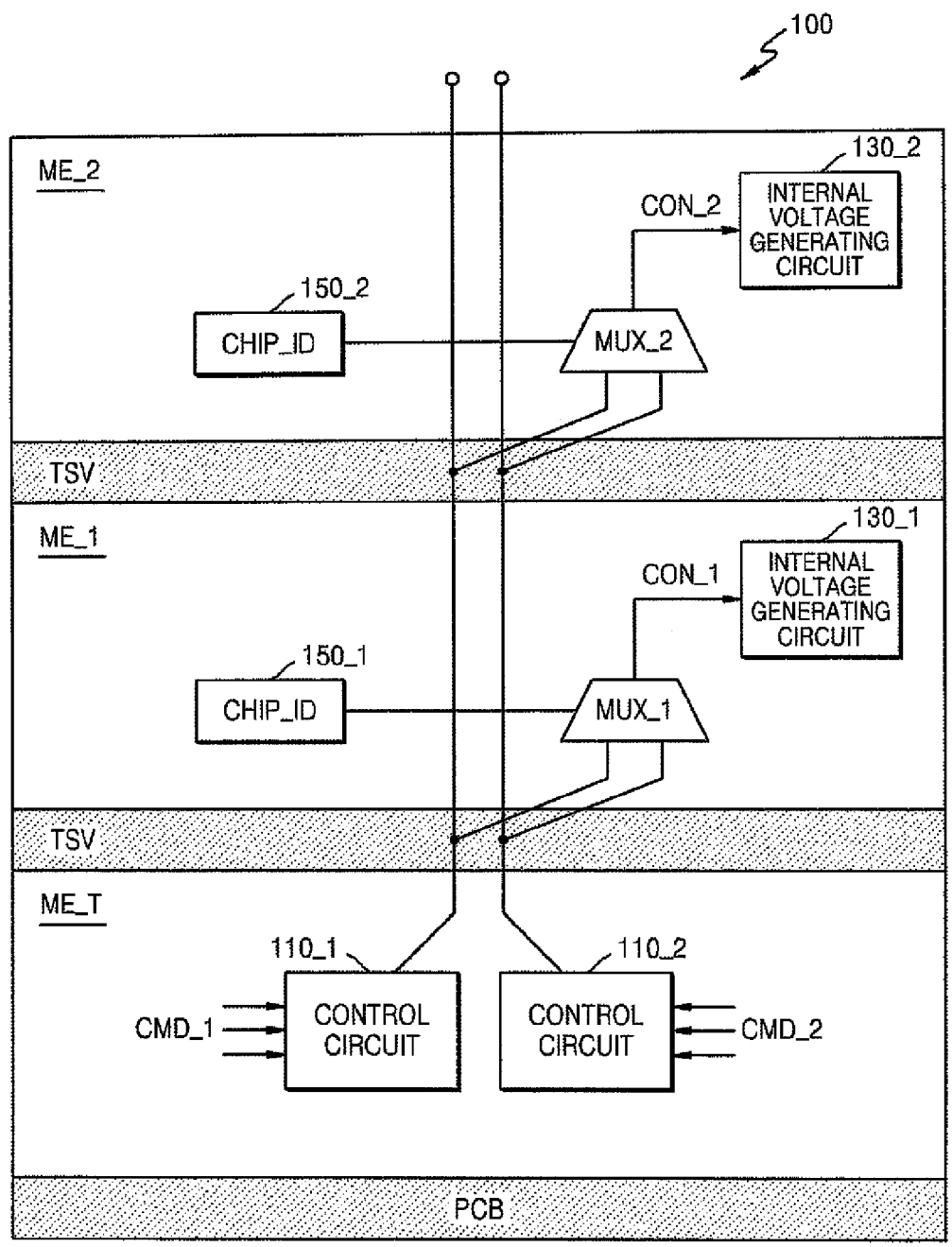
FIG. 1 is a cross-sectional view and schematic diagram of a multi-chip package (MCP) memory device according to an embodiment of the invention.

Hereinafter, the invention will be described more fully with reference to the accompanying drawings, in which exemplary embodiments of the invention are shown. Like reference numerals in the drawings denote like elements.

FIG. 1 is a cross-sectional view and schematic diagram of a multi-chip package (MCP) memory device 100 according to an embodiment of the present invention. Referring to FIG. 1, a MCP memory device 100 includes a transfer memory chip ME_T, a first memory chip ME_1 and a second memory chip ME_2. The transfer memory chip ME_T transfers command signals received from outside the MCP memory device 100 to the first memory chip ME_1 and a second memory chip ME_2. The transfer memory chip ME_T may also transfer data of the first memory chip ME_1 and/or the second memory chip ME_2 to outside the MCP memory device 100. The transfer memory chip ME_T may be an interface chip mounted on a printed circuit board (PCB).

The first memory chip ME_1 and the second memory chip ME_2 may be stacked on the transfer memory chip ME_T. That is, the first memory chip ME_1 may be mounted onto the transfer memory chip ME_T, and the second memory chip ME_2 may be mounted onto the first memory chip ME_1. The memory chips ME_1 and ME_2 are configured to support data reads and writes.

Operations of the multi-chip package memory 100 will now be described with reference to generating an internal voltage.

The transfer memory chip ME_T is configured to receive signals from outside the MCP memory device 100. Such signals may include commands CMD. Hereinafter, commands for the first memory chip ME_1 are referred to as CMD_1 and commands for the second memory chip ME_2 are referred to as CMD_2. The transfer memory chip ME_T may include control circuits 110_1 and 110_2. The control circuit 110_1 outputs a first control signal CON_1 to control a first internal voltage (not shown in FIG. 1) that is provided to the first memory chip ME_1. In addition, the control circuit 110_2 outputs a second control signal CON_2 to control a second internal voltage (not shown in FIG. 1) that is provided to the second memory chip ME_2.

Although not shown in FIG. 1, each of the control circuits 110_1 and 110_2 may include a command decoder and a logic device. Each of the command decoders is configured to decode the received command (CMD_1 or CMD_2). Each of the logic devices output a control signal (CON_1 or CON_2) in response to the decoded command.

The first control signal CON_1 or the second control signal CON_2 may be transferred from the transfer memory chip ME_T to the first memory chip ME_1 or the second memory chip ME_2 using a through one or more through silicon vias (TSVs). Each of the TSVs may be a through-hole via.

The first memory chip ME_1 may include an internal voltage generating circuit 130_1, a multiplexer (mux) MUX_1, and a chip identifier (CHIP_ID) 150_1. The mux MUX_1 transfers the first control signal CON_1 to the internal voltage generating circuit 130_1 in response to the CHIP_ID 150_1. The internal voltage generating circuit 130_1 generates and outputs the first internal voltage (not shown) that is provided to the first memory chip ME_1 in response to the first control signal CON_1.

The second memory chip ME_2 operates similarly to the first memory chip ME_1. The second memory chip ME_2 may include an internal voltage generating circuit 130_2, a mux MUX_2, and a CHIP_ID 150_2. The mux MUX_2 transfers the second control signal CON_2 to the internal voltage generating circuit 130_2 in response to the CHIP_ID 150_2. The internal voltage generating circuit 130_2 generates and outputs the second internal voltage (not shown) that is provided to the second memory chip ME_2 in response to the second control signal CON_2.

Variations to the MCP memory device illustrated in FIG. 1 are possible. For instance, instead of a PCB, the MCP substrate could be or include, for example, ceramic, silicon, sapphire, or other suitable material. The ceramic, silicon, or sapphire substrate could include one or more layers of copper or other electrically-conductive traces, as needed for signal and power distribution. In alternative embodiments of the invention, more than two memory chips may be stacked onto the transfer memory chip ME_T. Moreover, in alternative embodiments, the first memory chip ME_1 and the second memory chip ME_2 may be mounted directly to the transfer memory chip ME_T. Furthermore, the first memory chip ME_1 and the second memory chip ME_2 could be mounted directly to the PCB or other substrate.

Figure 2:
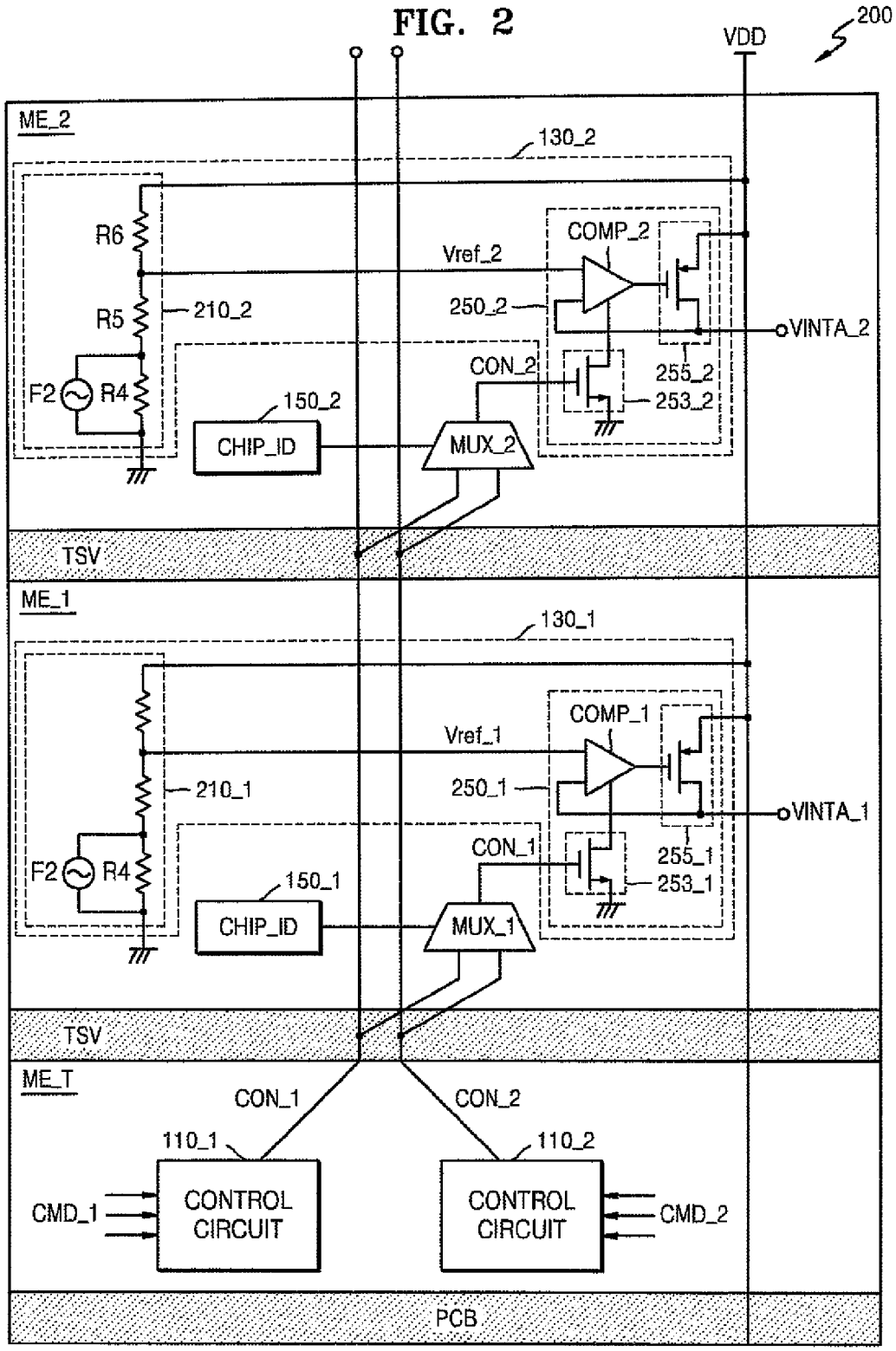
FIG. 2 is a cross-sectional view and schematic diagram of a multi-chip package (MCP) memory device including circuit diagrams of the internal voltage generating circuits of FIG. 1.

FIG. 2 is a cross-sectional view and schematic diagram of a multi-chip package (MCP) memory device 200 including circuit diagrams for an embodiment of the internal voltage generating circuits 130_1 and 130_2 shown in FIG. 1.

In FIG. 2, a control circuit 110_1 of a transfer memory chip ME_T outputs a first control signal CON_1, and a control circuit 110_2 outputs a second control signal CON_2.

An internal voltage generating circuit 130_1 of the first memory chip ME_1 may include a reference voltage generating unit 210_1 and an internal voltage controlling unit 250_1. The reference voltage generating unit 210_1 is configured to output a first reference voltage Vref_1 to the voltage controlling unit 250_1. The reference voltage generating unit 210_1 generates the first reference voltage Vref_1 by dividing the potential difference between a power supply voltage VDD and a ground voltage. Accordingly, the reference voltage generating unit 210_1 may include resistors R1, R2, and R3 coupled in series between VDD and GND. In the illustrated embodiment, a fuse F1 is also coupled in parallel with resistor R1 so that the value of the first reference voltage Vref_1 can be adjusted according to the state of the fuse F1.

The internal voltage controlling unit 250_1 controls the voltage level of the first internal voltage VINTA_1 in response to the first reference voltage Vref_1, the first control signal CON_1, and a first internal voltage feedback signal VINTA_1. The internal voltage controlling unit 250_1 may include a comparator COMP_1, a current sink unit 253_1, and an internal voltage generating unit 255_1. The comparator COMP_1 compares the first reference voltage Vref_1 and the first internal voltage feedback signal VINTA_1 and outputs a comparison signal. The current sink unit 253_1 controls a driving voltage of the comparator COMP_1 in response to the first control signal CON_1. The current sink unit 253_1 may be a transistor (as shown). The driving voltage of the comparator COMP_1 can be controlled since a current flowing through the transistor is changed according to the voltage level of the first control signal CON_1. The internal voltage generating unit 255_1 generates and outputs the first internal voltage VINTA_1 in response to the comparison signal output from the comparator COMP_1.

The internal voltage generating circuit 130_2 is substantially the same as the internal voltage generating circuit 130_1. The internal voltage generating circuit 130_2 may include a reference voltage generating unit 210_2 and an internal voltage controlling unit 250_2. The reference voltage generating unit 210_2 outputs a second reference voltage Vref_2 to the internal voltage controlling unit 250_2. The reference voltage generating unit 210_2 generates the second reference voltage Vref_2 by dividing a potential difference between the power supply voltage VDD and a ground voltage. The reference voltage generating unit 210_2 may include multiple resistors R4, R5, and R6 coupled in series between VDD and the ground voltage. In the illustrated embodiment, a fuse F2 is coupled in parallel with resistor R4 so that the value of the second reference voltage Vref_2 can be adjusted according to the state of the fuse F2.

The internal voltage controlling unit 250_2 controls the voltage level of the second internal voltage VINTA_2 in response to the second reference voltage Vref_2, the second control signal CON_2 and a second internal voltage feedback signal VINTA_2. The internal voltage controlling unit 250_2 may include a comparator COMP_2, a current sink unit 253_2 and an internal voltage generating unit 255_2. The comparator COMP_2 compares the second reference voltage Vref_2 and the second internal voltage feedback signal VINTA_2 and outputs a comparison signal. The current sink unit 253_2 controls driving voltage of the comparator COMP_2 in response to the second control signal CON_2. The internal voltage generating unit 255_2 generates and outputs the second internal voltage VINTA_2 in response to the comparison signal.

The configuration illustrated in FIG. 2 is an exemplary embodiment for controlling voltages output from the internal voltage generating circuits 130_1 and 130_2. However, alternative configurations for the internal voltage generating circuits 130_1 and 130_2 are also possible. For instance, in one respect, other resistor and fuse configurations are possible to implement the voltage-divider function performed by the reference voltage generating units 210_1 and 210_2.

FIG. 3 is a flow diagram of a method for controlling an internal voltage of a multi-chip package (MCP) memory device, according to an embodiment of the invention. Although the method in FIG. 3 is described below with reference to the MCP memory devices in FIGS. 1 and 2, the method could also be applied to other memory device configurations.

Referring to FIG. 3, a transfer memory chip outputs $1^{st}$ to $n^{th}$ signals in response to received command signals (S310). For instance, a transfer memory chip ME_T outputs a first control signal CON_1 and a second control signal CON_2 in response to received command signals CMD_1 and CMD_2, respectively.

Next, a $k^{th}$ control signal is transferred to a $k^{th}$ memory chip (S320). For example, the mux MUX_1 of the first memory chip ME_1 selects and outputs the first control signal CON_1 to the internal voltage generating circuit 130_1. Likewise, the mux MUX_2 of the second memory chip ME_2 selects and outputs the second control signal CON_2 to the internal voltage generating circuit 130_2.

Finally, an internal voltage provided to the kth memory chip is controlled by the kth control signal (S330). For instance, the internal voltage generating circuit 130_1 controls the first internal voltage VINTA_1 provided to the first memory chip ME_1 in response to the first control signal CON_1. Similarly, the internal voltage generating circuit 130_2 controls the second internal voltage VINTA_2 provided to the second memory chip ME_2 in response to the second control signal CON_2.

In one embodiment of step S330, the internal voltage generating circuit 130_1 generates a first reference voltage Vref_1 to which the first internal voltage VINTA_1 of the first memory chip ME_1 is referenced, and controls the voltage level of the first internal voltage VINTA_1 in response to the first reference voltage Vref_1, the first control signal CON_1 and a first internal voltage feedback signal VINTA_1. In addition, the internal voltage generating circuit 130_2 generates a second reference voltage Vref_2 to which the second internal voltage VINTA_2 of the second memory chip ME_2 is referenced, and controls the voltage level of the second internal voltage VINTA_2 in response to the second reference voltage Vref_2, the second control signal CON_2 and a second internal voltage feedback signal VINTA_2.

FIGS. 1 and 2 describe a multi-chip package (MCP) memory device that includes a transfer memory chip ME_T and two memory chips (ME_1 and ME_2) stacked thereon. In alternative embodiments, the transfer memory chip ME_T can generate and output n control signals when n memory chips are stacked on the transfer memory chip ME_T, wherein n is a natural number as described above.

A consequence of embodiments of the invention is that the size of memory chips in a MCP memory device can be reduced. More specifically, the size of the stacked memory chips can be reduced by building a part of an internal voltage generating circuit in a transfer memory chip rather than in each of the memory chips. This configuration also simplifies the manufacturing process for the memory chips and the MCP memory device.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A multi-chip package (MCP) memory device comprising:
    a transfer memory chip; and
    a plurality of memory chips coupled to the transfer memory chip, wherein
    each of the plurality of memory chips includes an internal voltage generating circuit, comprising;
    a reference voltage generating unit configured to generate a reference voltage; and
    an internal voltage controlling unit coupled to the reference voltage generating unit and configured to output an internal voltage based on the reference voltage, one of the plurality of control signals, and an internal voltage feedback signal, and
    the transfer memory chip is configured to receive a plurality of command signals from outside the MCP memory device, and output a plurality of control signals to the plurality of memory chips based on the plurality of command signals.

2. The MCP memory device of claim 1, wherein a first one of the plurality of memory chips is mounted on the transfer memory chip, and a second one of the plurality of memory chips is mounted on the first one of the plurality of memory chips.

3. The MCP memory device of claim 1, wherein the internal voltage generating circuit is configured to output the internal voltage to a corresponding one of the plurality of memory chips based on a corresponding one of the plurality of control signals.

4. The MCP memory device of claim 1, wherein the transfer memory chip includes a plurality of control circuits, each of the plurality of control circuits corresponding to one of the plurality of memory chips.

5. The MCP memory device of claim 4, wherein each of the plurality of control circuits includes:
    a command decoder; and
    a logic device coupled to the command decoder, the command decoder configured to decode one of the plurality of command signals to produce a decode command signal, the logic device configured to output one of the plurality of control signals based on the decoded command signal.

6. The MCP memory device of claim 1, wherein each of the plurality of memory chips includes a multiplexer configured to transfer a selected one of the plurality of control signals to the internal voltage generating circuit.

7. The MCP memory device of claim 6, wherein each of the plurality of memory chips includes a chip identifier (ID) coupled to the multiplexer, the chip ID configured to output an ID signal to the multiplexer, the multiplexer configured to transfer a selected one of the plurality of control signals to the internal voltage generating circuit based on the ID signal.

8. The MCP memory device of claim 1, further comprising at least one through hole via configured to transfer the plurality of control signals from the transfer memory chip to the plurality of memory chips.

9. The MCP memory device of claim 1, wherein the reference voltage generating unit includes:
    a plurality of resistors coupled in series between a power supply voltage and a ground voltage; and
    a fuse coupled in parallel with at least one of the plurality of resistors.

10. The MCP memory device of claim 1, wherein the internal voltage controlling unit includes:
    a comparator configured to compare the reference voltage and the internal voltage feedback signal and, output a comparison signal;
    a current sink unit configured to control a driving voltage of the comparator in response to one of the plurality of control signals; and
    an internal voltage generating unit configured to generate the internal voltage in response to the comparison signal.

11. The MCP memory device of claim 1, wherein the transfer memory chip is an interface chip mounted on a printed circuit board and outputting the control signals to the memory chips.

12. A method for controlling a plurality of memory chip voltages in a multi-chip package (MCP) memory device, the MCP memory device including a plurality of memory chips coupled to a transfer memory chip, the method comprising:
    receiving a plurality of command signals in the transfer memory chip, the plurality of command signals originating outside the MCP memory device;
    outputting a plurality of control signals from the transfer memory chip to the plurality of memory chips based on the received plurality of command signals;
    in each of the plurality of memory chips, selecting a corresponding one of the plurality of control signals to produce a selected control signal; and
    in each of the plurality of memory chips, controlling a corresponding one of the plurality of memory chip voltages based on the selected control signal, wherein controlling the corresponding one of the plurality of memory chip voltages includes generating a reference voltage and comparing a memory voltage feedback signal to the reference voltage.

13. The method of claim 12, wherein selecting the corresponding one of the plurality of control signals includes multiplexing the plurality of control signals based on a memory chip identifier.

14. The method of claim 12, wherein generating the reference voltage includes voltage dividing a supply voltage.

15. A multi-chip package (MCP) memory device comprising:
    a transfer memory chip configured to receive a plurality of command signals from outside the MCP memory device; and
    a plurality of memory chips coupled to the transfer memory chip, the transfer memory chip configured to output a plurality of control signals to each of the plurality of memory chips based on the plurality of command signals, each of the plurality of memory chips including:
a multiplexer coupled to receive a plurality of control signals from the transfer memory chip;
a chip identifier configured to output an identification signal to the multiplexer, the multiplexer configured to output a selected one of the plurality of control signals based on the identification signal;
a voltage control unit coupled to receive a selected one of the plurality of control signals from the multiplexer, wherein the voltage control unit includes:
a first transistor, a first terminal for the first transistor coupled to an output terminal of the multiplexer, a second terminal of the first transistor coupled to ground;
a comparator, a first input terminal for the comparator coupled to a reference voltage, a third terminal of the first transistor coupled to a driving terminal of the comparator; and
a second transistor, a first terminal of the second transistor coupled to an output terminal of the comparator, a second terminal of the second transistor coupled to a supply voltage, a third terminal of the second transistor coupled to a second input terminal of the comparator; and
a reference voltage source configured to output the reference voltage to the voltage control unit, the voltage control unit configured to generate an internal voltage based on the reference voltage and the selected one of the plurality of control signals.

16. The MCP memory device of claim 15, wherein the transfer memory chip includes a plurality of voltage generating circuits, each of the voltage generating circuits configured to output one of the plurality of control signals.

* * * * *